US 6,624,502 B2

(12) United States Patent
Alagi

(10) Patent No.: US 6,624,502 B2
(45) Date of Patent: Sep. 23, 2003

(54) METHOD AND DEVICE FOR LIMITING THE SUBSTRATE POTENTIAL IN JUNCTION ISOLATED INTEGRATED CIRCUITS

(75) Inventor: Filippo Alagi, Arluno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 149 days.

(21) Appl. No.: 09/794,261

(22) Filed: Feb. 27, 2001

(65) Prior Publication Data

US 2001/0017398 A1 Aug. 30, 2001

(30) Foreign Application Priority Data

Feb. 29, 2000 (EP) .............................................. 00830155

(51) Int. Cl.[7] .............................................. H01L 29/00
(52) U.S. Cl. ...................... 257/560; 257/552; 257/561; 257/573
(58) Field of Search ................................ 257/552, 560, 257/561, 573

(56) References Cited

U.S. PATENT DOCUMENTS 5,729,040 A    3/1998  Sano ........................... 257/504
5,942,783 A  *  8/1999  Brambilla et al. ........... 257/372
6,194,764 B1  *  2/2001  Gossner et al. ............. 257/355

FOREIGN PATENT DOCUMENTS

| DE | 3507181 | 9/1986 | ........... H01L/23/56 |
| EP | 0678919 | 10/1995 | ........... H01L/27/02 |
| EP | 0847089 | 6/1998 | ........... H01L/27/88 |
| JP | 01261856 A | * 10/1989 | ........... H01L/27/04 |

OTHER PUBLICATIONS

Patent Abstracts of Japan, vol. 008, No. 119 (E–248), Jun. 5, 1984 & JP 59 032150 A (Tokyo Shibaura Denki KK), Feb. 21, 1984.

* cited by examiner

Primary Examiner—Eddie Lee
Assistant Examiner—Matthew E. Warren
(74) Attorney, Agent, or Firm—Lisa K. Jorgenson; Allen, Dyer, Doppelt, Milbrath & Gilchrist, P.A.

(57) ABSTRACT

A substrate potential limiting device for an integrated circuit that includes a semiconductor substrate is provided. The device includes at least one unidirectional element connected between a substrate contact on the semiconductor substrate and a reference potential. The unidirectional element may be a bipolar transistor. The bipolar transistor includes a base and a collector connected to the at least one substrate contact and an emitter connected to the reference potential.

6 Claims, 2 Drawing Sheets

METHOD AND DEVICE FOR LIMITING THE SUBSTRATE POTENTIAL IN JUNCTION ISOLATED INTEGRATED CIRCUITS

FIELD OF THE INVENTION

The present invention relates to semiconductor integrated circuits with junction isolation and, in particular, to a method and a device for reducing parasitic effects in semiconductor integrated circuits. Particularly but not exclusively, the present invention concerns a device for limiting the substrate potential in junction isolated integrated circuits.

BACKGROUND OF THE INVENTION

As is well known by one skilled in the art, in junction insulated integrated circuits the substrate is held at a reference potential by contacts which are typically placed on the bottom surface of the substrate. The bottom of the substrate is commonly referred to as the back of the integrated circuit. Each integrated circuit region doped opposite from the substrate is normally biased to a higher potential than the reference potential. Such an integrated circuit region is typically formed on the top surface of the substrate. The top surface of the substrate is commonly referred to as the front. The various regions of the integrated circuit are isolated electrically by reverse biased P-N junctions.

During operation, transient bias conditions may occur and cause the undesired flow of currents in the substrate of the integrated circuit. These currents are conventionally attributed to the activation of parasitic bipolar transistors, which may either be of the PNP type or the NPN type. Such transient bias conditions are mostly experienced upon a change of polarity on inductive loads such as inductors and motors, or on capacitive loads such as capacitors, batteries and rechargeable batteries.

In particular, transient bias conditions may cause electrons or holes to be injected into the substrate and generate parasitic currents therein. Electrons can be injected into the substrate, for example, when an N-type region is forward biased in the P-type substrate. In such a case, electrons may reach the substrate contact areas toward the referring potential and recombine with the substrate holes, or reach another N region which is reverse biased with respect to the substrate. Particularly in the latter case, as the electrons reach a reverse biased N-type region, a parasitic bipolar transistor known as a lateral NPN transistor becomes activated.

For example, holes can be picked up by the substrate when a P region inside an isolated region of the N-type is forward biased with respect to the N-type isolated region, itself reversed biased with respect to the substrate. The holes are injected from the P region into the N region. A portion of the holes may recombine with electrons present in the N-type region, and another portion can be picked up by the substrate. In the latter case, the collected holes within the substrate are responsible for a parasitic bipolar transistor, known as a vertical PNP transistor, being activated.

The substrate holes can migrate to the areas of contact with the reference potential, typically located on the substrate back. This current can locally raise the potential at the substrate front. The locally raised substrate potential may forward bias, with respect to the substrate, N-type regions which are normally reversed biased with respect to the substrate. The situation may activate structures of the PNPN type and trigger local currents with a current density capable of destroying the integrated circuit.

A first prior approach to lessening the effects of activating vertical PNP parasitic transistors comprises, as shown in FIG. 1, one or more connections 1 to the reference potential on the front of the substrate 2, and additionally to the connection 3 to the reference potential which is located on the back of the integrated circuit. The connections 1 to the reference potential constrain the substrate potential, at least locally, to the value of the reference potential. This prevents the substrate potential from attaining suitable values for activating lateral NPN parasitic transistors, for example.

However, the connections 1 to the reference potential placed on the integrated circuit front can become, in the presence of a lateral NPN parasitic transistor, a preferential path for the base current of the NPN parasitic transistor, thus enhancing the transistor efficiency.

The underlying technical problem of the present invention is to provide a device and a related method for limiting the substrate potential with appropriate structural and functional features suitable to stop the substrate potential from exceeding the reference potential by a predetermined amount. This thereby avoids the inception of parasitic currents and overcomes the limitations and/or drawbacks of devices formed according to the prior art.

SUMMARY OF THE INVENTION

The concept behind the present invention is to provide a unidirectional element on the conduction path between the substrate and the reference potential, whereby the substrate potential is limited to a value only slightly above the reference potential, and every current flow likely to activate parasitic transistors, particularly of the lateral NPN type, is interrupted.

Based upon this concept, the technical problem is solved by a device comprising at least one unidirectional element connected between the substrate and the reference potential. The technical problem is also solved by a method of locally limiting the potential at the substrate surface in an integrated circuit. The method provides for a unidirectional element to be connected between the substrate surface and the reference potential.

BRIEF DESCRIPTION OF THE DRAWINGS

The features and advantages of the device and of the method according to the present invention will be apparent in the following description of embodiments thereof, given by way of non-limitative examples with reference to the accompanying drawings.

DETAILED DESCRIPTION OF THE PREFERRED EMBODIMENTS

Figure 1:
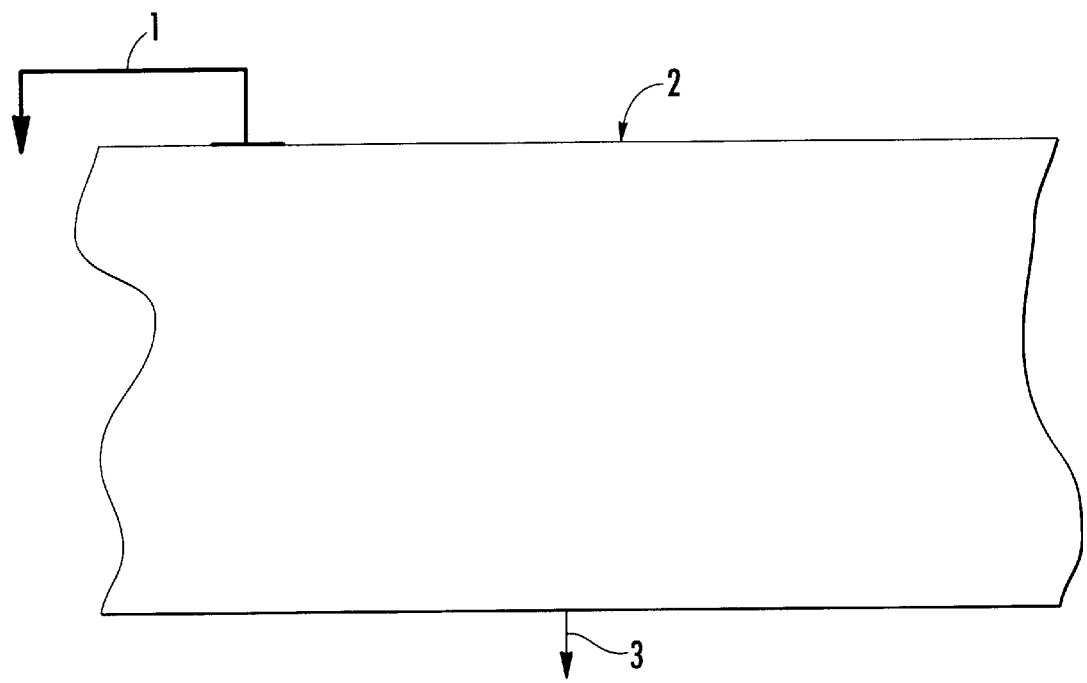
FIG. 1 schematically shows an enlarged vertical view of an integrated circuit portion containing a device according to the prior art.
Figure 2:
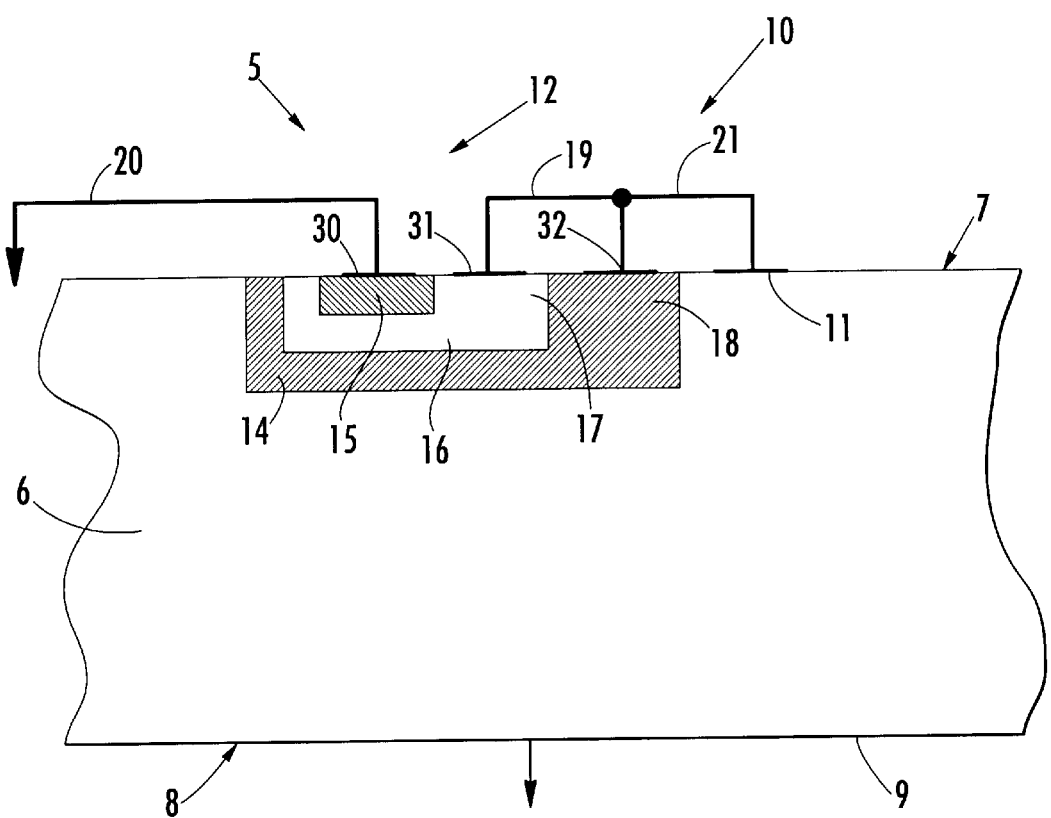
FIG. 2 schematically shows an enlarged vertical view of an integrated circuit portion containing a device according to the present invention.

Shown in FIG. 2 is a vertical cross-section of a portion of an integrated circuit which includes a device 5 according to the present invention, and a semiconductor substrate 6. In the non-limitative example being discussed herein, the substrate 6 is essentially doped with impurities of the P-type. The substrate 6 is delimited by a top surface 7, known as the front, and a back 8. The back 8 of the substrate 6 is connected to a reference potential by a contact 9 which extends over the entire surface of the substrate 6. The contact 9 is typically a metallization layer.

The device 5 comprises a unidirectional element 10. A substrate contact 11 is placed on the front 7 of the substrate 6. A first connection 21 is between the contact 11 and the unidirectional element 10, and a second connection 20 is between the unidirectional element 10 and the reference potential. In the embodiment previously described with reference to FIG. 2, the unidirectional element 10 comprises a bipolar transistor 12 formed in the substrate 6.

In this non-limitative example, the transistor 12 is of the NPN type. In particular, the transistor 12 is formed in the front 7 of the substrate 6. The transistor 12 comprises a first region 14 doped with N-type impurities and is formed on the front 7 of the substrate 6. A second region 16 is doped with P-type impurities and is formed on the front 7 inside the first region 14. A third region 15 is doped with N-type impurities and is formed on the front 7, inside the second region 16.

The third region 15 is formed within the second region 16 such that a portion 17 of the second region 16 extends over the front 7. Similarly, the second region 16 is formed within the first region 14 such that a portion 18 of the first region 14 extends over the front 7. The first region 14, the second region 16, and the third region 15 provide the collector, base, and emitter, respectively, of the transistor 12. The base may be referred to as the control terminal, and the collector and emitter may be referred to as the conducting terminals, as would be readily understood by those skilled in the art.

First 30, second 31 and third 32 contacts are provided on the third region 15 surface, on the portion 17 and on the portion 18, respectively. The base and collector of the transistor 12 are connected together through a third connection 19 between the second contact 31 and the third contact 32 provided on the portions 17 and 18, respectively, of the transistor 12. The emitter of the transistor 12 is connected to the reference potential through the second connection 20 between the first contact 30 and the reference potential.

The base and the collector of the transistor 12 are further connected through the first connection 21 to the substrate contact 11 located on the substrate 6 front. The first, second and third regions 14, 16 15, the first, second and third contacts 30, 31, 32, the substrate contact 11, and the first, second and third connections 21, 20, 19 are all typically formed by conventional integrated circuit fabrication techniques.

The transistor 12, which has its base connected to its collector and to the substrate 6, and has its emitter connected to the reference potential, represents a preferred embodiment of a unidirectional element 10 connecting the substrate contact 11 to the reference potential. The operation of the device 5 according to the invention will now be described.

The third connection 19 forms a diode connection of the transistor 12. In use, there are typically two different situations. In the first situation, the potential of the substrate front 7 at the substrate contact 11 does not exceed the reference potential by a predetermined value. Whereas in the second situation, the potential of the substrate front 7 at the substrate contact 11 does exceed the reference potential by the predetermined value.

The predetermined value is within the range of 0 volt to 1 volt, preferably 0 volt to 0.7 volt, and more preferably equal to a few tenths of a volt. Particularly in the former of the situations, the transistor 12 is in its cut-off range. In fact, if the potential of the substrate front 7 at the substrate contact 11 does not exceed the reference potential by the predetermined value, then also the potential at the base of the transistor 12 is typically at a potential not exceeding the emitter potential of the transistor 12 by the predetermined value. The base of the transistor 12 is connected to the collector and to the substrate 6 by the first connection 21.

In fact, with the emitter of the transistor 12 being connected to the reference potential through the first contact 30 and the second connection 20, the emitter is at the same potential as the reference potential. In this situation, the device 10 is not conducting. In particular, the potential of the substrate front 7 and at the substrate contact 11 can become negative with respect to the reference potential without the device 10 conducting.

In the second situation, the transistor 12 is in its active range. In fact, when the potential of the substrate front 7 at the substrate contact 11 exceeds the reference potential by a predetermined value, the base potential of the transistor 12 is typically at a potential which is the predetermined value higher than the emitter potential of the transistor 12. The base of the transistor 12 is connected to the collector and to the substrate 6 by the first connection 21.

This second situation can be due to the effect of possible parasitic currents appearing in the substrate contact 11. In this situation, the device 10 conducts and advantageously limits the potential of the substrate front 7 at the substrate contact 11 to the predetermined value.

Thus, to limit the substrate potential in integrated circuits with junction isolation, the present invention provides for the connection of one or more unidirectional elements between the substrate and the reference potential to attenuate the effects of parasitic currents generated within integrated circuits.

Figure 3:
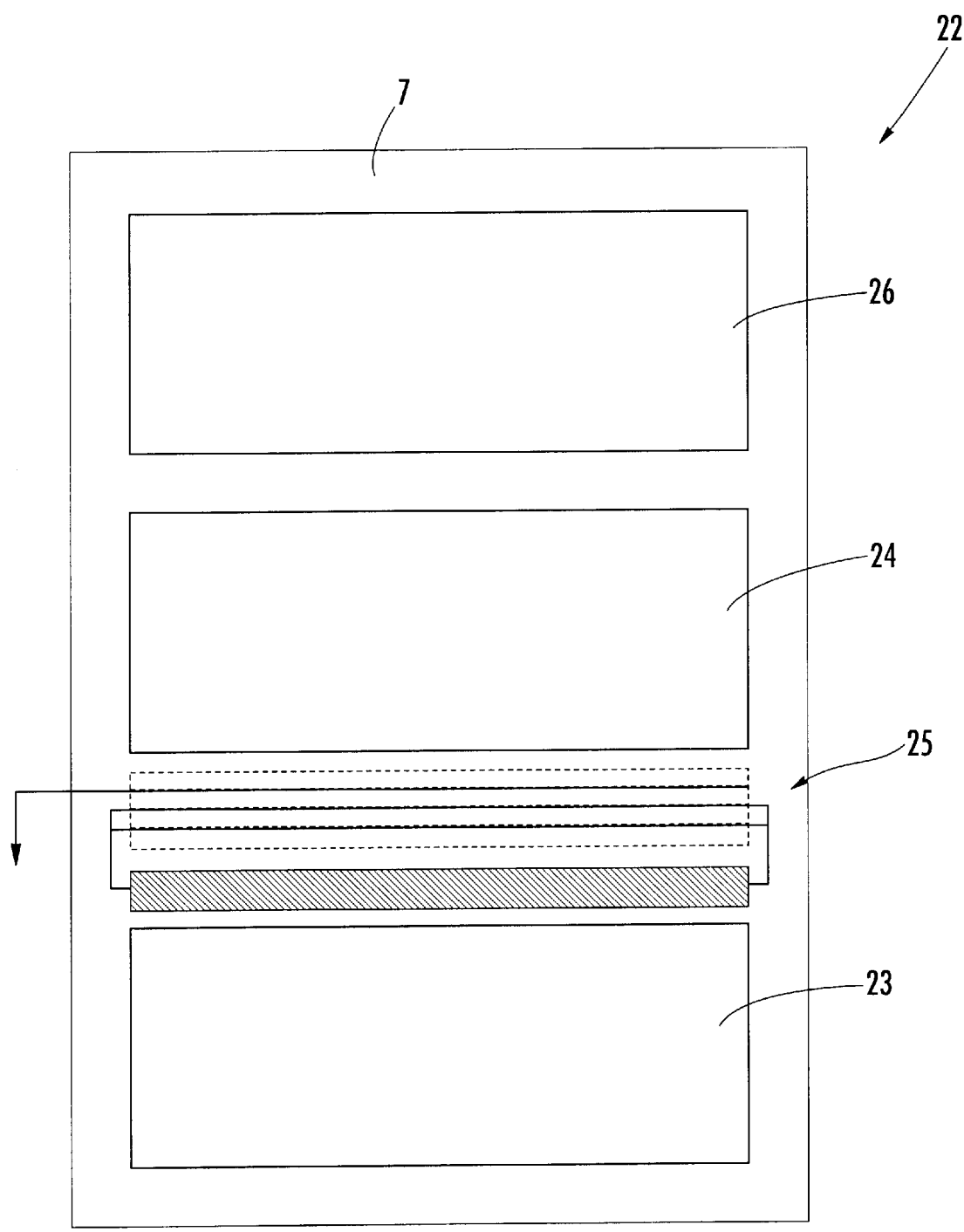
FIG. 3 schematically shows a top plan view of an integrated circuit in a preferred embodiment which includes the device according to the present invention.

A preferred embodiment of an integrated circuit according to the present invention is shown schematically in FIG. 3. An integrated circuit 22 has a first portion 23, a second portion 24 isolated from the first portion 23 by a device 25 according to the present invention, and a third portion 26. The first portion 23 is arranged primarily to control the integrated circuit, and is suitable to lodge regions sensitive to both the effects of activating vertical PNP parasitic transistors and to the effects of activating lateral NPN parasitic transistors.

The second 24 and third 26 portions comprise a section of the integrated circuit circuitry which is mainly intended for driving power transistors. In particular, the second portion 24 typically is suitable to lodge regions which are likely to activate parasitic transistors of the vertical PNP type, while the third portion 26 typically includes regions which are likely to activate parasitic transistors of the lateral NPN type.

In operation of the circuit, the portion of the integrated circuit which lodges the second 24 and third 26 portions of the integrated circuit might originate parasitic currents because of the aforementioned PNP and NPN bipolar parasitic transistors. These parasitic currents may lead to the destruction of the circuitry housed in the first portion 23 as a consequence of the large power involved in driving the transistors in the second and third portions 24 and 26.

The device 25, placed between the first portion 23 and the second portion 24 on the integrated circuit surface prevents that the surface potential of the substrate 7 at the first portion 23 will attain such values as to trigger parasitic transistors, typically of the lateral NPN type, within the first portion 23. In particular, the device 25 is effective to limit the surface potential of the substrate 7 at the first portion 23 to a predetermined approximate value. Where the device 25 is of the type previously described, this predetermined value is in the 0 volt to 1 volt range, preferably in the 0 volt to 0.7 volt range, and even more preferably is equal to a few tenths of a volt. Thus, the device 25 provides a barrier towards the first sensitive portion 23, and against any parasitic currents generated in the second portion 24 as a consequence of PNP parasitic transistors becoming activated.

That which is claimed is:

1. A substrate potential limiting device for an integrated circuit comprising a semiconductor substrate including at least one substrate contact, the substrate potential limiting device comprising:

at least one transistor in the semiconductor substrate and comprising a base and a collector both connected to the at least one substrate contact, and an emitter connected to a voltage reference.

2. A substrate potential limiting device according to claim 1 wherein said at least one transistor comprises an NPN bipolar transistor.

3. A substrate potential limiting device according to claim 1, wherein the collector includes a first collector portion and a second collector portion interfacing a surface of the semiconductor substrate, wherein the base is between the first and second collector portions and includes a first base portion and a second base portion interfacing the surface of the semiconductor substrate, and wherein the emitter is between the first and second base portions and includes a first emitter portion interfacing the surface of the semiconductor substrate.

4. An integrated circuit comprising:

a semiconductor substrate including at least one substrate contact; and at least one transistor in said semiconductor substrate for limiting a potential of said semiconductor substrate, and comprising a base and a collector both connected to the at least one substrate contact, and an emitter connected to a voltage reference.

5. A substrate potential limiting device according to claim 4, wherein said at least one transistor comprises an NPN bipolar transistor.

6. A substrate potential limiting device according to claim 4, wherein the collector includes a first collector portion and a second collector portion interfacing a surface of the semiconductor substrate, wherein the base is between the first and second collector portions and includes a first base portion and a second base portion interfacing the surface of the semiconductor substrate, and wherein the emitter is between the first and second base portions and includes a first emitter portion interfacing the surface of the semiconductor substrate.

* * * * *